United States Patent [19]

Toyama et al.

[11] 4,341,856

[45] Jul. 27, 1982

[54] PHOTOSENSITIVE LITHOGRAPHIC PRINTING PLATE PRECURSORS

[75] Inventors: Tadao Toyama; Sho Nakao; Keisuke Shiba, all of Shizuoka; Hidefumi Sera; Masasi Ogawa, both of Minami-ashigara, all of Japan

[73] Assignee: Fuji Photo Film Co., Ltd., Kanagawa, Japan

[21] Appl. No.: 237,057

[22] Filed: Feb. 23, 1981

[30] Foreign Application Priority Data

Feb. 22, 1980 [JP] Japan .................................. 55/21372

[51] Int. Cl.$^3$ ............................ G03C 1/76; G03F 7/02
[52] U.S. Cl. ..................................... 430/156; 430/264; 430/302; 430/502; 430/503
[58] Field of Search ............... 430/156, 302, 264, 502, 430/503

[56] References Cited

U.S. PATENT DOCUMENTS

| T870,005 | 1/1970 | Woodward | 430/302 |
| 3,567,445 | 3/1971 | Atkinson et al. | 430/156 |
| 4,188,215 | 2/1980 | Sato et al. | 430/156 |
| 4,256,825 | 3/1981 | Loprest | 430/142 |
| 4,268,609 | 5/1981 | Shiba et al. | 430/503 |
| 4,283,478 | 8/1981 | Kubotera et al. | 430/306 |

FOREIGN PATENT DOCUMENTS

1227603 4/1971 United Kingdom ................ 430/156

*Primary Examiner*—Mary F. Downey
*Attorney, Agent, or Firm*—Sughrue, Mion, Zinn, Macpeak & Seas

[57] ABSTRACT

A photosensitive lithographic printing plate precursor comprising a support having a hydrophilic surface and having thereon a non-silver photosensitive layer capable of forming a water-insoluble oleophilic image and a hardened gelatino silver halide photosensitive emulsion layer on the non-silver photosensitive layer.

13 Claims, No Drawings

PHOTOSENSITIVE LITHOGRAPHIC PRINTING PLATE PRECURSORS

FIELD OF THE INVENTION

The present invention relates to photosensitive lithographic printing plate precursors for producing lithographic printing plates and, particularly, to photosensitive lithographic printing plate precursors with a gelatino silver halide photosensitive emulsion layer on a non-silver photosensitive layer.

BACKGROUND OF THE INVENTION

Photosensitive lithographic printing plate precursors comprising a non-silver photosensitive layer such as a photosensitive layer comprising an o-quinonediazide compound provided on a support having a hydrophilic surface such as an aluminum plate and a gelatino silver halide photosensitive emulsion layer provided on the layer are described in, for example, British Pat. No. 1,227,603. The plate making process for producing lithographic printing plates from such photosensitive lithographic printing plate precursors comprises the steps of (a) imagewise exposing to light the gelatino silver halide photosensitive emulsion layer and (b) developing it to form a silver image, (c) uniformly exposing to light the non-silver photosensitive layer masked by the silver image formed, (d) removing the silver image-containing layer (namely, the gelatino silver halide photosensitive emulsion layer imagewise exposed to light and developed) by washing out, and (e) developing the non-silver photosensitive layer.

In this plate making process, it is necessary for the silver image formed in the above-described step (b) to be firmly adhered to the non-silver photosensitive layer to serve as a mask until the uniform exposure step (c) is concluded and for it to be easily removed from the non-silver photosensitive layer in the wash-out step (d).

However, in the prior photosensitive lithographic printing plate precursors, there was the disadvantage that the gelatino silver halide photosensitive emulsion layer easily dissolved in the development step (b). Particularly, in processing using a roller conveyor type automatic plate making machine, a serious disadvantage existed in that the gelatino silver halide photosensitive emulsion layer was damaged or separated from the non-silver photosensitive layer when such was passed through rolls in the development zone and it did not sufficiently serve as a mask in the subsequent uniform exposure step (c), by which a desired lithographic printing plate could not be obtained.

SUMMARY OF THE INVENTION

Accordingly, an object of the present invention is to provide a photosensitive lithographic printing plate precursor capable of being used to produce printing plates having excellent oil-receptivity properties which form images of excellent quality without causing pinholes and stains.

A further object of the present invention is to provide a photosensitive lithographic printing plate precursor comprising a gelatino silver halide photosensitive emulsion layer which does not dissolve in a developing solution and is not damaged by rollers, etc., because such does not swell during the development step for the gelatino silver halide photosensitive emulsion layer, but is easily removed from the non-silver photosensitive layer in the wash-out step.

As a result of much research for attaining the above-described objects, the present invention has been completed. The present invention provides a photosensitive lithographic printing plate precursor comprising a support with a hydrophilic surface having thereon a non-silver photosensitive layer capable of forming a water-insoluble oleophilic image and a gelatino silver halide photosensitive emulsion layer on the non-silver photosensitive layer, wherein the gelatino silver halide photosensitive emulsion layer is hardened.

DETAILED DESCRIPTION OF THE INVENTION

Techniques for hardening silver halide contained binders are well known in the field of silver salt photography. According to these techniques, it is possible to prevent dissolution of the silver salt photosensitive layer in a processing solution and to improve adhesion to the support.

On the contrary, the gelatino silver halide photosensitive emulsion layer of the photosensitive lithographic printing plate precursor according to the present invention must be easily removed from the support after it has fulfilled the function of a mask. The technique for hardening the silver salt photosensitive layer of photosensitive lithographic printing plate precursor having such a characteristic has not been known hitherto, which is an entirely new technique.

Further, it has now been found that a preferred embodiment of the present invention is controlling the degree of hardening of the gelatino silver halide photosensitive emulsion layer. This embodiment comprises the gelatino silver halide photosensitive emulsion layer being hardened so that the dissolution time in a 0.01 weight% aqueous solution of a protease (1,000,000 tyrosine units/g) at 40° C. is 7 to 150 seconds.

Where a lithographic printing plate is produced using the photosensitive lithographic printing plate precursor of the present invention, by, particularly, continuously processing each step in an automatic processing machine, there is no lack of images and no deterioration of image quality which were observed in the prior photosensitive lithographic printing plates and, further, there is no printing stains or deterioration of oil-receptivity property caused by poor-washing-out. Accordingly, when the resulting lithographic printing plate is used for printing using an offset printing machine, prints having high quality can be obtained after only a few sheets from the beginning of printing.

The dissolution time by which the degree of hardening of the silver halide photosensitive emulsion layer of the present invention is characterized is measured in the following manner.

A test tube filled with a 0.01 weight% aqueous solution of a protease (1,000,000 tyrosine units/g) is nearly perpendicularly placed in a constant temperature water bath kept at 40° C., and the test tube is allowed to stand for a period sufficient to bring the solution to 40° C.

The photosensitive lithographic printing plate precursor of the present invention is cut to a size of 5 mm × 200 mm to produce a test sample. This test sample is put in the test tube and the time at which the gelatino silver halide photosensitive emulsion layer of the test sample is separated from the non-silver photosensitive layer by dissolution is measured with, e.g., a stop watch, etc. This time is designated the dissolution time herein.

Where the dissolution time measured by the above-described method is less than 7 seconds, the gelatino silver halide photosensitive emulsion layer dissolves during the silver halide development or is damaged by conveying rollers in an automatic developing machine, whereby the function as a mask in the subsequent uniform exposure step is not fulfilled and remarkable lack of images or deterioration of image quality occurs in the resulting printing plate.

If the dissolution time is more than 150 seconds, the gelatino silver halide photosensitive emulsion layer is hardened and sufficiently fulfills the function of a mask. However, the resulting printing plate has disadvantages with respect to adhesion of inks or stains of the background. Further, the part washed out is only slightly soluble in the wash-out solution and scum or dregs are formed which cause blocking of a sprayer of the automatic processing machine or cause a trouble that they adhere again to the non-silver photosensitive layer because of adhesion to conveying rollers.

Accordingly, the gelatino silver halide photosensitive emulsion layer is hardened so that the dissolution time is 7 to 150 seconds and preferably 7 to 80 seconds.

Further, the dissolution time of the photosensitive layers of conventional silver salt photographic sensitive materials is 180 seconds or more when measured by the above-described method.

Compounds which can be used for hardening the gelatino silver halide photosensitive emulsion layer are inorganic and organic hardening agents for gelatin conventionally used in the silver salt photographic sensitive material art. For example, chromium salts (chromium alum and chromium acetate, etc.), aldehydes (formaldehyde, glyoxal and glutaraldehyde, etc.), N-methylol compounds (dimethylol urea and methylol dimethylhydantoin, etc.), dioxane derivatives (2,3-dihydroxydioxane, etc.), active vinyl compounds (1,3,5-triacryloylhexahydro-s-triazine and bis(vinylsulfonyl)methyl ether, etc.), active halogen compounds (2,4-dichloro-6-hydroxy-s-triazine, etc.), mucohalic acids (mucochloric acid and mucophenoxychloric acid, etc.), isoxazoles, ketone compounds (diacetyl and cyclopentadione, etc.), isocyanates as described in U.S. Pat. No. 3,103,437, etc., carbodiimide compounds as described in U.S. Pat. No. 3,100,704, etc., epoxy compounds as described in U.S. Pat. No. 3,091,537, etc., dialdehyde starch and 2-chloro-6-hydroxytriazinyl gelatin, etc., which may be used alone or as a combination thereof, can be used.

The hardening agent used in the present invention is added as an aqueous solution to the silver halide photosensitive emulsion. Although the optimum amount of the hardening agent depends upon the reactivity of the hardening agent, the amount is suitably selected so as to obtain the desired degree of hardening in the present invention as measured by the dissolution time herein.

Further, it is known that the reactivity of the hardening agent depends upon the drying condition after coating of the silver halide photosensitive emulsion. Generally, drying of the gelatino silver halide photosensitive emulsion layer is carried out by a method which comprises blowing warm air against the layer after the emulsion layer is set by blowing cool air at 10° C. or less. However, in the present invention, it is remarkably effective from the standpoint of suitable adhesion of the silver halide photosensitive layer to the non-silver photosensitive layer that drying of the gelatino silver halide photosensitive layer of the complex type photosensitive lithographic printing plate precursor according to the present invention is carried out by a method which comprises blowing hot air directly onto the emulsion layer at 60° to 150° C. without setting the gelatin as described in U.S. patent application Ser. No. 169,253, filed July 16, 1980, now U.S. Pat. No. 4,268,609. As a result of examining various hardening agents under such drying conditions, it has now been found that aldehydes, dioxanes and mucohalic acids which provide a low degree of hardening under conventional setdrying are surprisingly advantageous because they cause a high degree of hardening under the above-described condition. Among these hardening agents, it has been found that dialdehydes represented by the following formula (I) and dioxanes represented by the following formula (II) are particularly preferred:

OHC—R$_1$—CHO (I)

where in formula (I) R$_1$ represents a methylene chain of the formula —(CH$_2$)$_n$—, where n represents an integer of 0 to 5 which may be substituted with alkyl groups, aryl groups, hydroxyl groups or sulfonic acid groups (or the alkali metal salts thereof);

where in the formula (II), R$_2$ represents a hydrogen atom or an alkyl group (preferably, one having 1 to 5 carbon atoms).

Among these compounds, glyoxal, glutaraldehyde, 2,3-dihydroxydioxane and 2,3-dihydroxy-5-methyldioxane are particularly advantageous, because hardening is nearly completed under hot air drying by which the change in the quality of the hardened layer is small. These compounds are preferably employed in an amount of about 0.5 millimol to about 20 millimols, and preferably 2 millimols to 4 millimols, based on 100 g of gelatin in the gelatino silver halide photosensitive emulsion layer. Further, the above-described non-set drying is preferably carried out using hot air at 60° C. to 150° C.

Constituents of the photosensitive lithographic printing plate precursor of the present invention are illustrated as follows. The support used in the present invention is a support which has a hydrophilic surface. Any support may be used if it can be used for the lithographic printing plate, but aluminum plates are particularly preferred. The surface of the aluminum plates is preferably subjected to surface treatment such as a graining treatment, a chemical treatment with an aqueous solution of, for example, sodium silicate, potassium fluorozirconate and phosphates, etc., or an anodic oxidation treatment, etc. The type of support, the surface treatment and the anodic oxidation which can be used in the present invention are disclosed in U.S. Pat. No. 4,238,560.

Examples of non-silver photosensitive layer capable of forming an oleophilic image provided on the support are photosensitive layers suitable for photosensitive lithographic printing plate precursors (presensitized plates called "PS" plates). The term "oleophilic" property as used herein means the property that the layer repels dampening water used for printing but is receptive to oily inks. Examples of such non-silver photosensitive layers are that comprising a diazo resin, that comprising an o-quinonediazido compound, that comprising a photosensitive azide compound, that comprising a high molecular weight compound containing a group of the formula

in the main chain or a side chain of the polymer, and a photopolymerizable composition comprising an addition polymerizable unsaturated compound and a photopolymerization initiator, etc., which are all well known in the art. These compositions are coated as a solution in a suitable solvent on the support so that the dry weight is about 0.1 g/m² to about 5 g/m².

The gelatino silver halide photosensitive emulsion provided on the non-silver photosensitive layer may be a conventional negative type or direct-positive emulsion and can be a conventional emulsion of silver chloride, silver bromide, silver iodide or mixed silver halide, which preferably has a mean grain size of 0.7 μm or less.

Further, the amount of the hydrophilic colloid comprising mainly gelatin which is the binder of the silver halide grains preferably is in the range of 10 g to 200 g based on 1 kg of the emulsion. The gelatino silver halide photosensitive emulsion can be subjected to chemical sensitization such as sulfur sensitization, reduction sensitization or sensitization with noble metal salts, etc., or to spectral sensitization with sensitizing dyes. In addition, various additives used conventionally may be employed.

A particularly preferred gelatino silver halide photosensitive emulsion which can be used in the present invention is a silver halide emulsion containing at least about 20 mol% of silver chloride, at most about 80 mol% of silver bromide and 0 to 2 mol% of silver iodide.

Further, the gelatino silver halide photosensitive emulsion layer preferably contains a substantially water-insoluble oleophilic resin in a finely divided state (preferably a particle size of 0.01μ to 10μ). A preferred amount of the oleophilic resin is 1 to 10 parts by weight based on 10 parts by weight of the hydrophilic colloid (mainly, gelatin) of the silver halide emulsion. Examples of the above-described oleophilic resin include shellac, a polyamide resin, a phenol resin, a polyvinyl acetal resin, a linear polyurethane resin and a polyester resin, etc.

The gelatino silver halide photosensitive emulsion layer is provided on the non-silver photosensitive layer directly or through an intermediate layer. The amount of the emulsion employed is about 1 g/m² to about 10 g/m² and, preferably, 2 to 6 g/m².

The method and the processing for producing lithographic printing plates using the photosensitive lithographic printing plate precursor of the present invention are as follows. First, the photosensitive layer containing silver halide is imagewise exposed to light to form a latent image of silver halide in the layer. Then, development of the silver halide (first development) is carried out. Just after the development or after processing with a fixing solution, the photosensitive layer is uniformly exposed to actinic light including ultraviolet light. Examples of developers and fixers which can be used in the present invention are disclosed in U.S. patent application Ser. No. 176,154, filed Aug. 7, 1980, now U.S. Pat. No. 4,299,912. After the gelatino silver halide emulsion layer is washed out, the plate is subjected to the second development step, where only the non-image part of the non-silver photosensitive layer is removed by dissolution to expose the hydrophilic surface of the support, and thus a printing plate is obtained.

In this case, the processing solution for the second development is a solution which dissolves selectively only the non-image part of the non-silver photosensitive layer. Particularly, the processing solution can be selected from developing solutions used for development of conventional PS plates with a non-silver photosensitive layer or developing solutions analogous thereto. For example, where the non-silver photosensitive layer is one comprising an o-quinonediazide compound, an aqueous solution of sodium silicate and a developing solution described in U.S. Pat. No. 4,141,733 can be used.

The present invention is illustrated in greater detail by reference to the following examples.

All percents are by weight unless otherwise indicated.

EXAMPLE 1

A 2S aluminum plate mechanically grained was immersed in a 2% aqueous solution of sodium hydroxide kept at 40° C. for 1 minute to corrode a part of the surface. After the plate was washed with water, it was immersed for 1 minute in a sulfuric acid-chromic acid solution to expose a surface of pure aluminum. It was immersed in a 20% sulfuric acid aqueous solution maintained at 30° C. and anodic oxidation was carried out for 2 minutes under conditions of a direct current voltage of 1.5 V and a current density of 3A/dm². Then, the plate was washed with water and dried. A photosensitive solution having the following composition was then coated continuously using an extrusion coater in a dry weight of 2 g/m².

| | |
|---|---|
| Naphthoquinone-1,2-diazide-(2)-5-sulfonic Acid Ester of Acetone-Pyrogallol Resin (synthesized by the process described in Example 1 of U.S. Pat. No. 3,635,709) | 2.5 g |
| Cresol-Formaldehyde Resin | 5.0 g |
| Methyl Ethyl Ketone | 75 g |
| Cyclohexanone | 60 g |

Silver halide photosensitive emulsions having the following Compositions A to E were then coated uniformly and continuously using an extrusion coater in a dry weight of 4.0 g/m², respectively, and dried subsequently at 80° C. for 3 minutes with hot air to produce Samples A to E.

Composition A

An emulsion which was prepared by dissolving 25 g of a phenol-formaldehyde resin MP-120HH (produced by Gunei Kagaku Kogyo Co.) and 25 g of dioctyladipate in a mixture of 330 g of ethyl acetate and 120 g of methyl ethyl ketone and dispersing the resulted solution in a solution prepared by mixing 60 ml of a 10% solution of sodium nonylbenzenesulfonate and 150 ml of 10% Turkey red oil in methanol with 600 ml of a 10% aqueous solution of gelatin—1,300 g Silver Chlorobromide Gelatino Emulsion (silver chlorobromide comprising Cl⁻: 70 mol% and Br⁻: 30 mol%, mean grain size: 0.28μ, gelatin: 55 g based on 1 kg of the emulsion, and silver halide content: 0.85 mol)—2,000 g 0.1% Methanol Solution of the Sodium Salt of 1,3-Diethyl-5-{2-[3-(3-sulfopropyl)benzoxazol-2-ylidene]ethylidene}thiohydantoin—100 ml 0.5% Aqueous Solution of 4-Hydroxy-6-methyl-1,3,3a,7-tetrazaindene—200 ml Compositions B to E Compositions prepared by adding a 1% aqueous solution of glyoxal in the following amount to the above-described Composition A.

| | |
|---|---|
| Composition B | 5 ml |
| Composition C | 20 ml |
| Composition D | 35 ml |
| Composition E | 70 ml |

After Samples A to E had been allowed to stand at room temperature (about 20°–30° C.) for 1 week, they were subjected to plate making processing as follows. Using a negative film having a letter image on a scale of about 1 to 5, the samples were exposed to light for 10 seconds with an enlarger having a light source of 300 luxes in an enlargement of 5 times. Then, the following processing was carried out using an automatic developing machine. The samples were passed through the first development zone filled with a developing solution (I) having the following composition at 32° C. over 30 seconds and they were then passed through the fixing zone filled with the following fixing solution (I) at 25° C. over 10 seconds. Subsequently, they were passed through the ultraviolet light exposure zone equipped with three reflection type mercury lamps for 15 seconds and they were rubbed with a brush with immersion in warm water at 40°–45° C. in the washing-out zone. They were passed through squeezing rolls into the second development zone filled with a developing solution (II) having the following composition and passed therethrough at 30° C. for a 30 second period. They were processed with a 14° Be aqueous solution of gum arabic to produce lithographic printing plates.

| Composition of Developing Solution (I): | |
|---|---|
| Water | 700 ml |
| Metol (monomethyl p-aminophenol sulfate) | 3.0 g |
| Sodium Sulfite | 45.0 g |
| Hydroquinone | 12.0 g |
| Sodium Carbonate (monohydrate) | 80.0 g |
| Potassium Bromide | 2 g |
| Water to make | 1 l |

This solution was used by dilution (1:2 by volume) with water.

| Developing Solution (II): | |
|---|---|
| Sodium Silicate (JIS No. 1) | 100 g |
| Sodium Metasilicate | 50 g |
| Pure Water | 1,800 ml |
| Fixing Solution (I): | |
| Water | 700 ml |
| Ammonium Thiosulfate | 224 g |
| Sodium Sulfite | 20 g |
| Water to make | 1,000 ml |

Using the resulted printing plates, printing was carried out using a Heidel KOR printer.

In the lithographic printing plates obtained from Samples C and D, good prints were obtained after 4–5 sheets from the beginning of printing were printed. The printing endurance was about 110,000 sheets.

In Samples A and B, the gelatino silver halide photosensitive layer swelled or partially dissolved in the first development zone of the plate making process, and the silver image was damaged by the conveying rollers. Accordingly, the image did not sufficiently fulfill the function of a mask in the subsequent ultraviolet light exposure step, and the resulting printing plates had lack of images and deterioration of image quality.

Further, in Sample E, the gelatino silver halide photosensitive layer was not sufficiently washed out in the wash-out step of the plate making process. Further, since scum or dregs washed out were pressed against the printing plate by the squeezing rolls, prints were obtained only after 15 sheets from the beginning of printing had been printed and the resulting prints had thick line drawings and remarkable pinhole stains.

Further, in these samples, the dissolution time of the gelatino silver halide emulsion layer in a 0.01 weight% aqueous solution of Pronase E (a protease produced by Kaken Kagaku Co., 1,000,000 tyrosine units/g) at 40° C. (referred to as dissolution time, hereinafter) was as follows.

| Sample | Dissolution Time (seconds) |
|---|---|
| A | 3 |
| B | 6 |
| C | 23 |
| D | 50 |
| E | more than 180 |

EXAMPLE 2

A sample was produced in the same manner as described in Example 1 except that 60 ml of a 1% aqueous solution of glutaraldehyde was added to Composition (A). When the same plate making processing was carried out, the resulting printing plate showed excellent properties in the beginning of printing and produced prints with excellent image quality and no stains. The printing durability was 110,000 sheets. The dissolution time of this sample was 30 seconds.

EXAMPLE 3

A printing plate was produced in the same manner as in Example 2 except that 40 ml of a 1% solution of 2,3-dihydroxy-5-methyldioxane in water/methanol (1/1 by volume) was added instead of glutaraldehyde. When printing was carried out, the same results as in Example 2 were obtained. The dissolution time was 42 seconds.

EXAMPLE 4

A printing plate was produced in the same manner as in Example 2 except that 75 ml of a 2% aqueous solution of mucobromic acid was added instead of glutaraldehyde. When printing was carried out, good results similar to Example 2 were obtained. The dissolution time was 35 seconds.

EXAMPLE 5

A printing plate was produced in the same manner as in Example 2 except that 60 ml of a 2% aqueous solution of 2,4-dichloro-6-hydroxy-s-triazine was added instead of glutaraldehyde. When printing was carried out using a Heidel KOR-D printer, good results similar to Example 2 were obtained and the dissolution time was 80 seconds.

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate precursor, comprising:

a support having a hydrophilic surface and having thereon a non-silver photosensitive layer capable of forming a water-insoluble oleophilic image and a hardened gelatino silver halide photosensitive emulsion layer on said non-silver photosensitive layer, wherein;

said photosensitive emulsion layer is hardened to an extent that the dissolution time in a 0.01 weight % aqueous solution of a protease (1,000,000 tyrosine units/g) at 40° C. is 7 to 150 seconds.

2. The photosensitive lithographic printing plate precursor according to claim 1, wherein said gelatino silver halide photosensitive emulsion layer is hardened with (1) a dialdehyde represented by the formula (I)

OHC—R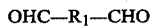—CHO     (I)

wherein R$_1$ represents a methylene chain of the formula —(CH$_2$)$_n$— where n represents an integer of 0 to 5 which may be substituted with alkyl groups, aryl groups, hydroxyl groups or sulfonic acid groups or the alkali metal salts of said sulfonic acid groups, or (2) a dioxane represented by the formula (II)

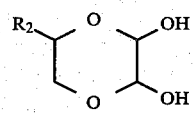     (II)

wherein R$_2$ represents a hydrogen atom or an alkyl group, as a hardening agent.

3. The photosensitive lithographic printing plate precursor according to claim 2, wherein said hardening agent is glyoxal, glutaraldehyde, 2,3-dihydroxydioxane, or 2,3-dihydroxy-5-methyldioxane.

4. The photosensitive lithographic printing plate precursor according to claim 3, wherein said hardening agent is present in an amount of about 0.5 to about 20 millimols, preferably 2 to 4 millimols, based on 100 g of gelatin in the gelatino silver halide photosensitive emulsion layer.

5. The photosensitive lithographic printing plate precursor as claimed in claim 1 wherein said photosensitive emulsion layer contains a substantially water-insoluble oleophilic resin in a finely divided particles of 0.01 m to 10 m in size.

6. The photosensitive lithographic printing plate precursor as claimed in claim 5, wherein said oleophilic resin is incorporated in an amount of 1 to 10 parts by weight based on 10 parts by weight of hydrophilic colloid of said photosensitive emulsion layer.

7. The photosensitive lithographic printing plate precursor as claimed in claim 6, wherein the coverage of said photosensitive emulsion layer is about 1 g/m$^2$ to about 10 g/m$^2$.

8. The photosensitive lithographic printing plate precursor as claimed in claim 7, wherein said coverage is 2 to 6 g/m$^2$.

9. The photosensitive lithographic printing plate precursor as claimed in claim 1 wherein said non-silver photosensitive layer is comprised of a diazo resin, an o-quinonediazide compound, a photosensitive azide compound, and a high molecular weight compound containing a group of the formula

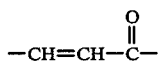

in the main chain or a side chain of the polymer, or a photopolymerizable composition comprising an additional polymerizable unsaturated compound and a photopolymerizable initiator.

10. A process for preparing a photosensitive printing plate precursor which comprises providing a non-silver photosensitive layer capable of forming a water-insoluble oleophilic image on a support, coating a gelatino silver halide photosensitive emulsion layer containing a hardening agent on said non-silver photosensitive layer and drying said gelatino silver halide photosensitive emulsion layer with a hot air at 60° to 150° C. so as to harden the photosensitive emulsion layer to an extent that the dissolution time in a 0.01 weight % aqueous solution of protease (1,000,000 tyrosine units/g) at 40° C. is 7 to 150 seconds.

11. The process as claimed in claim 10 wherein said hardening agent is selected from the group consisting of (1) dialdehydes represented by the formula (I)

OHC—R—CHO     (I)

wherein R$_1$ represents a methylene chain of the formula —(CH$_2$)$_n$— where n represents an integer of 0 to 5 which may be substituted with alkyl groups, aryl groups, hydroxyl groups or sulfonic acid groups or the alkali metal salts of said sulfonic acid groups, and (2) dioxanes represented by the formula (II)

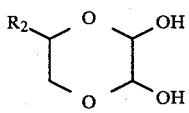     (II)

wherein R$_2$ represents a hydrogen atom or an alkyl group, as a hardening agent.

12. The process as claimed in claim 10 wherein said hardening agent is glyoxal, glutaraldehyde, 2,3-dihydroxydioxane, or 2,3-dihydroxy-5-methyldioxane.

13. The process as claimed in claim 12, wherein said hardening agent is present in an amount of about 0.5 to about 20 millimols, preferably 2 to 4 millimols, based on 100 g of gelatin in the gelatino silver halide photosensitive emulsion layer.

* * * * *